(12) United States Patent
Vaz et al.

(10) Patent No.: US 11,218,160 B1
(45) Date of Patent: Jan. 4, 2022

(54) PIPELINED ANALOG-TO-DIGITAL CONVERTER

(71) Applicant: XILINX, INC., San Jose, CA (US)

(72) Inventors: Bruno Miguel Vaz, Sao Domingos de Rana (PT); Vipul Bajaj, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/037,371

(22) Filed: Sep. 29, 2020

(51) Int. Cl.
*H03M 1/12* (2006.01)
*H03M 1/44* (2006.01)
*H03M 1/36* (2006.01)

(52) U.S. Cl.
CPC ......... *H03M 1/442* (2013.01); *H03M 1/1245* (2013.01); *H03M 1/362* (2013.01)

(58) Field of Classification Search
CPC .... H03M 1/442; H03M 1/362; H03M 1/1245; H03M 1/12
USPC .......................................................... 341/155
See application file for complete search history.

(56) References Cited

U.S. PATENT DOCUMENTS

| | | | | |
|---|---|---|---|---|
| 6,573,851 B2 * | 6/2003 | Bult | .......................... | H03F 3/70 341/155 |
| 6,753,801 B2 * | 6/2004 | Rossi | ...................... | H03F 3/005 341/161 |
| 7,750,737 B2 * | 7/2010 | Srinivasa | .............. | H03F 1/3211 330/259 |
| 8,643,429 B2 * | 2/2014 | Dedic | ...................... | H03M 1/12 327/415 |
| 9,318,184 B2 * | 4/2016 | Tyan | .................... | G11C 7/1084 |
| 10,033,395 B1 | 7/2018 | Vaz | | |
| 2003/0001768 A1 * | 1/2003 | Bult | .......................... | H03F 3/70 341/162 |
| 2004/0036453 A1 * | 2/2004 | Rossi | ...................... | H03F 3/005 323/242 |
| 2004/0160351 A1 * | 8/2004 | Rossi | ...................... | H03F 3/005 341/161 |
| 2005/0038846 A1 * | 2/2005 | Devendorf | ............... | G06G 7/14 708/801 |
| 2005/0219097 A1 * | 10/2005 | Atriss | ................... | H03M 1/162 341/144 |
| 2006/0033647 A1 * | 2/2006 | Leung | ................... | H02M 3/157 341/50 |

\* cited by examiner

*Primary Examiner* — Jean B Jeanglaude
(74) *Attorney, Agent, or Firm* — Patterson + Sheridan, LLP

(57) ABSTRACT

An analog-to-digital (ADC) circuit is disclosed that includes a first stage, a first amplifier, and a second amplifier. The first stage includes signal processing circuitry, and is configured to receive a differential input signal and generate a differential residue voltage signal on differential output nodes of the first stage. The first amplifier includes first amplifier circuitry. The first amplifier is electrically connected to the differential output nodes of the first stage, and configured to receive the differential residue voltage signal, and generate a first differential voltage signal from the differential residue voltage signal. The second amplifier includes second amplifier circuitry. The second amplifier is electrically connected to differential output nodes of the first amplifier, and configured to receive the first differential voltage signal, and generate a second differential voltage signal from the first differential voltage signal.

20 Claims, 9 Drawing Sheets

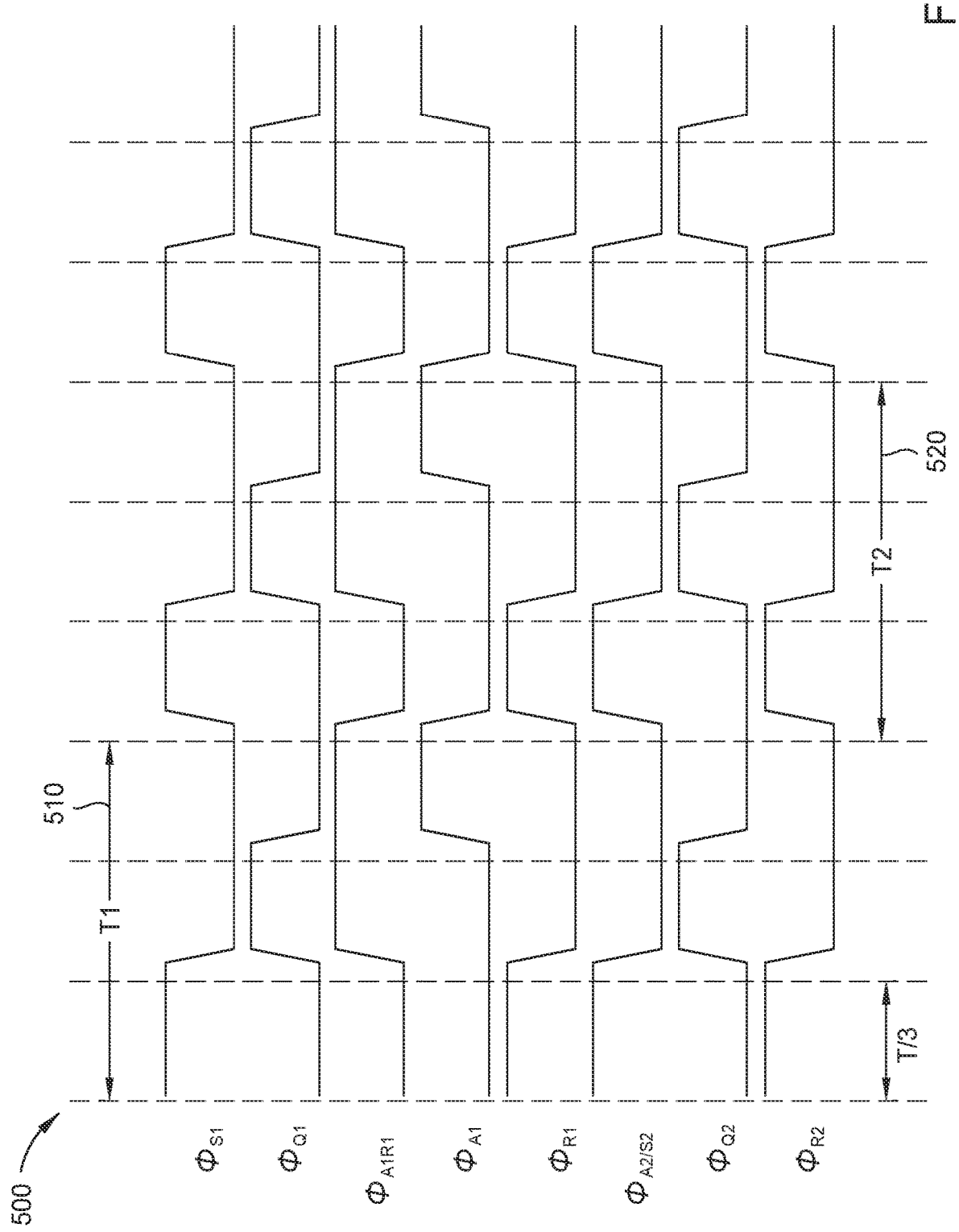

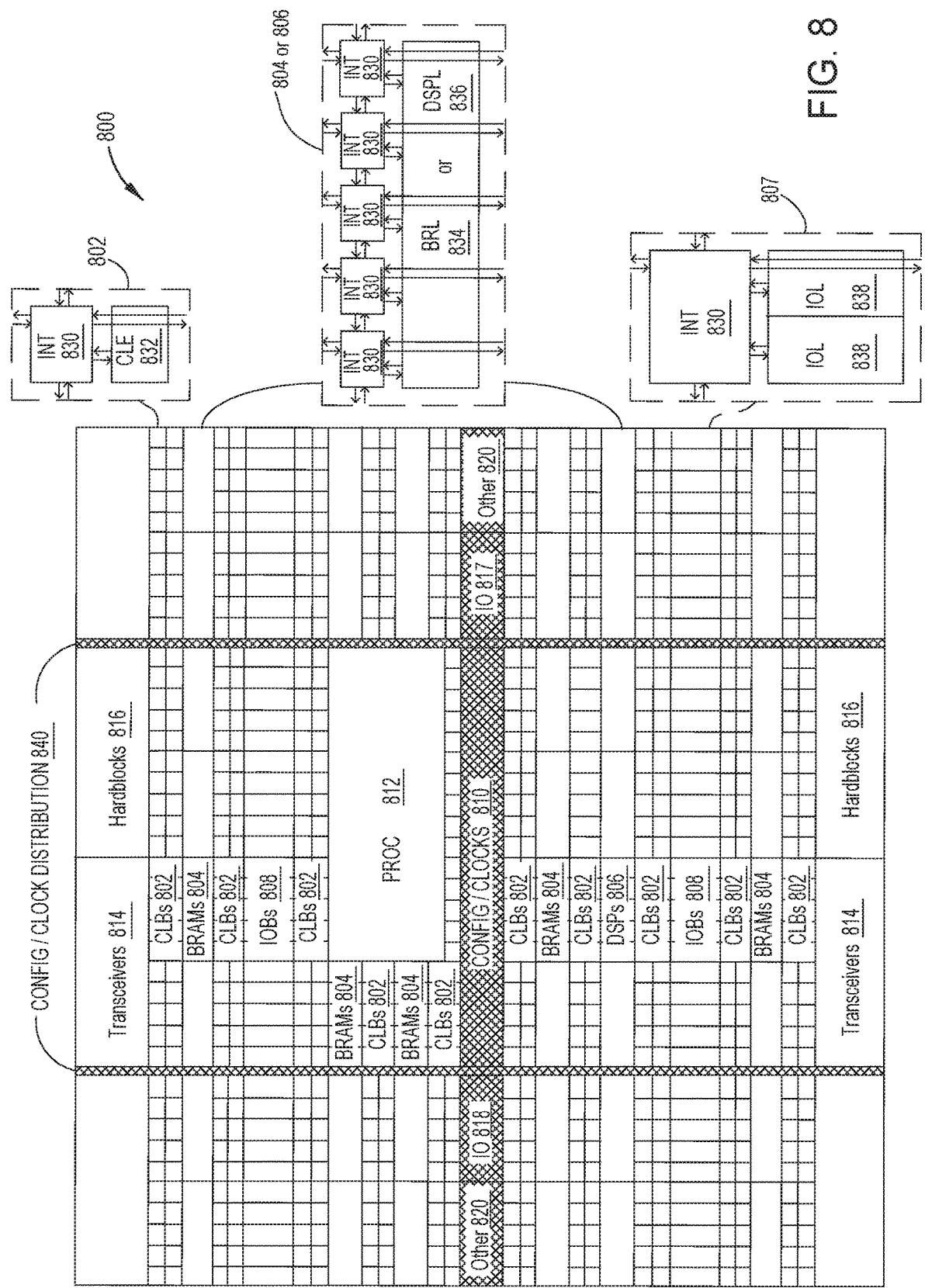

PIPELINED ANALOG-TO-DIGITAL CONVERTER

TECHNICAL FIELD

Examples of the present disclosure generally relate to pipelined analog-to-digital converters having multiple amplifier stages.

BACKGROUND

Pipelined analog-to-digital converters (ADCs) convert an input signal (e.g., a continuous analog waveform) into a discrete digital representation of the input signal. In many instances, pipelined ADCs include multiple blocks and employ a passive sampling (e.g., capacitive) digital to analog converter (DAC), a digital SAR control loop, and a comparator.

In various instances, a pipelined ADC includes a design where the output of one block of an ADC is input to another block of the ADC. In such instances, the ADC blocks utilize a serial processing technique to serially sample, quantize, and amplify an input signal. Accordingly, subsequent sampling and quantization operations are not completed until amplification of the corresponding input signal has been completed. Thus, the processing speed of the pipelined ADC corresponds to the total time required to complete the sampling, quantization, and amplification of each input signal. However, as the resolution and accuracy requirements of the pipelined ADC increase, serial processing techniques limit the operational speed of the pipelined ADCs, limiting the resolution and accuracy of the pipelined ADCs.

SUMMARY

Examples herein generally relate to a pipelined analog-to-digital converter (ADC) that decouples a portion of a residue amplification operation from the input signal sampling and the quantization operations to provide a reduced processing time, such that the pipelined ADC is able to operate at higher operating speeds as compared to other ADC designs.

In one example, an analog-to-digital converter (ADC) circuit comprises a first stage, a first amplifier, and a second amplifier. The first stage comprises signal processing circuitry, and is configured to receive a differential input signal and generate a differential residue voltage signal on differential output nodes of the first stage. The first amplifier comprises first amplifier circuitry. The first amplifier is electrically connected to the differential output nodes of the first stage, and configured to receive the differential residue voltage signal, and generate a first differential voltage signal from the differential residue voltage signal. The second amplifier comprises second amplifier circuitry. The second amplifier is electrically connected to differential output nodes of the first amplifier, and configured to receive the first differential voltage signal, and generate a second differential voltage signal from the first differential voltage signal.

In one example, a pipelined ADC circuit comprises a first ADC block and a second ADC block electrically connected to differential input nodes of the first ADC block. The second ADC block comprises a first stage, a first amplifier, and a second amplifier. The first stage is configured to receive a differential input signal, and generate a first differential residue voltage signal from the differential input signal received during a first period and generate a second differential residue voltage signal from the differential input signal received during a second period immediately subsequent to the first period. Generating the first differential residue voltage and generating the second differential residue voltage signal are non-overlapping. The first amplifier is electrically connected to first differential output nodes of the first stage and configured to generate a first differential voltage signal from the first differential residue voltage signal. The second amplifier is electrically connected to second differential output nodes of the first amplifier and configured to generate a second differential voltage signal from the first differential voltage signal during the second period.

In one example, a method for operating an ADC comprises generating, at a first stage of a first ADC block, a first differential residue voltage signal from an input signal, and generating, at a first amplifier of the first ADC block, a first differential voltage signal from the first differential residue voltage signal. The method further comprises generating, at a second amplifier of the first ADC block, a second differential voltage signal from the first differential voltage signal in response to, at least in part, a ready signal generated by the first amplifier.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 3, 4, and 5 illustrate example timing diagrams for operating a pipelined ADC, according to one or more examples.

FIG. 8 illustrates a field programmable gate array (FPGA) that may be implemented as a programmable device according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
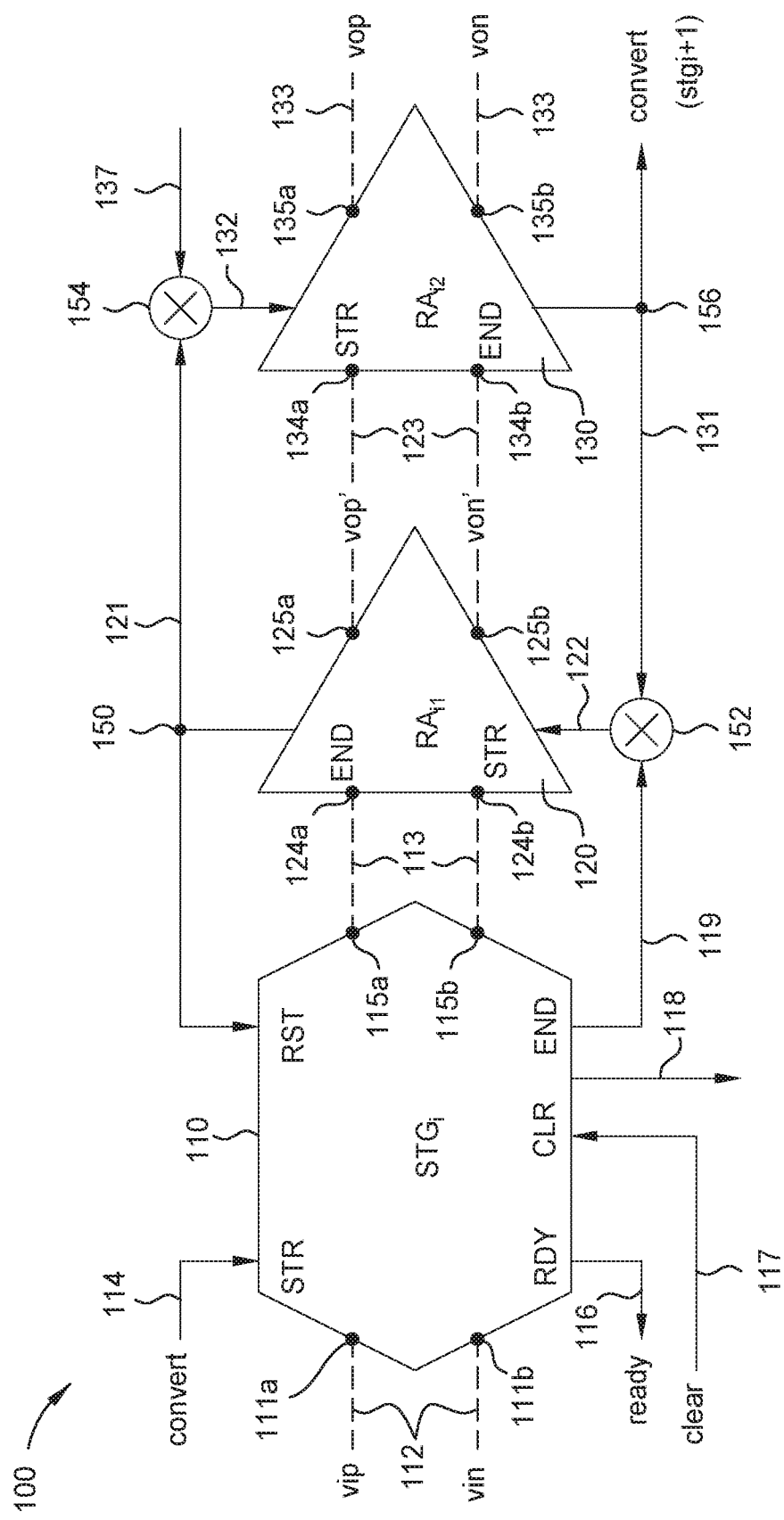
FIG. 1A depicts an example pipelined analog-to-digital converter (ADC) block, according to one or more examples.

Examples herein generally relate to a pipelined analog-to-digital converter (ADC) that decouples a portion of a residue amplification operation from the input signal sampling and the quantization operations. Accordingly, the residue amplification operation is decoupled from the process time budget of consecutive ADC quantization stages, increasing the speed at which a pipelined ADC is able to operate. One example pipelined ADC is a successive approximation register (SAR) ADC. However, in other example, other pipelined ADCs may be utilized.

As will be described in further detail in the following, a pipelined ADC includes multiple stages having multiple amplifiers positioned between adjacent stages. Accordingly, as multiple amplifiers are positioned between a first stage and a subsequent stage, at least a portion of the amplification operation is decoupled from the input sampling and quantization operations. For example, a first and second amplifier are positioned between the first stage and a subsequent stage. An input node of the first amplifier is electrically connected to an output node of the first stage, and an input node of the second amplifier is electrically connected to an output node of the first amplifier. The output node of the second amplifier is electrically connected to an input node of a subsequent stage. Such a configuration of stages and amplifiers allows for the amplification process of the second amplifier to be decoupled from input signal processing performed by the first stage. The first stage processes an input signal during a period that overlaps with a period when the second amplifier performs an amplification process. Accordingly, the total process time of the pipelined ADC is reduced, increasing the speed at which the pipelined ADC is able to function.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1A illustrates an example ADC block 100 of a pipelined ADC, according to one or more examples. In one example, the ADC block 100 is a block of a SAR ADC. Further, the block 100 may be a block of a voltage-to-time converter (VTC) followed by a time-to-digital converter (TDC) stage. The ADC block 100 includes a stage 110, an amplifier 120, and an amplifier 130. The pipelined ADC may be a pipelined SAR ADC. In other examples, the pipelined ADC is another type of pipelined ADCs.

The stage 110 has differential input nodes 111 (111a, 111b) and differential output nodes 115 (115a, 115b). The stage 110 may be referred to as a quantization stage. Further, the amplifier 120 has differential input nodes 124 (124a, 124b) and differential output nodes 125 (125a, 125b). The amplifier 130 has differential input nodes 134 (134a, 134b) and differential output nodes 135 (135a, 135b). The stage 110 may be referred to as a quantization stage.

The stage 110, the amplifier 120, and the amplifier 130 are electrically connected to each other in a serial orientation. The differential input nodes 124 of the amplifier 120 are electrically connected to the differential output nodes 115 of the stage 110. The differential output nodes 125 of the amplifier 120 are electrically connected to differential input nodes 134 of the amplifier 130. Further, the differential output nodes 135 of the amplifier 130 are electrically connected to the differential input nodes of a subsequent stage (e.g., the $212_2$ of FIG. 2). In one example, when differential nodes of different components are described as being electrically connected together, it is to be understood that the positive output node of the differential nodes of a component is electrically connected to the positive input node of the differential nodes of another component, and that the negative output node of the differential nodes of the component is electrically connected to the negative input node of the differential nodes of the other component. In other examples, other connections between input and output nodes of components are utilized.

The differential input nodes 111 of the stage 110 are configured to receive a differential input signal 112 (e.g., a differential voltage signal). The differential output nodes 115 are configured to output a differential residue voltage signal 113. The differential input signal 112 is a differential analog voltage signal or a differential digital voltage signal. Further, the differential input signal 112 may be a differential analog current signal or a differential digital current signal. The differential residue voltage signal 113 is an analog voltage signal. The differential residue voltage signal 113 is the analog residue voltage after completion of the quantization process of the stage 110.

The stage 110 includes multiple terminals that are each configured to receive a corresponding control signal. For example, a first terminal of the stage 110 is configured to receive a start signal (e.g., convert signal) 114; a second terminal of the stage 110 is configured to output a stage ready signal 116; a third terminal of the stage 110 is configured to receive a clear signal 117; a fourth terminal of the stage 110 is configured to receive a reset signal 121; a fifth terminal of the stage 110 outputs a stage end signal 119; and a sixth terminal of the stage 110 outputs a digital signal 118.

The stage 110 processes the differential input signal 112 in response to receiving the start signal 114. For example, in response to receiving the start signal 114, the stage 110 processes the differential input signal 112 to generate the differential residue voltage signal 113 and the digital signal (e.g., output digital quantization signal) 118. The start signal 114 is received every clock cycle immediately after sampling of the analog continuous signal. Further, the start signal 114 may be received from a previous ADC block. For example, in such an instance, the start signal 114 indicates that a differential input signal is available for processing.

Figure 1B:
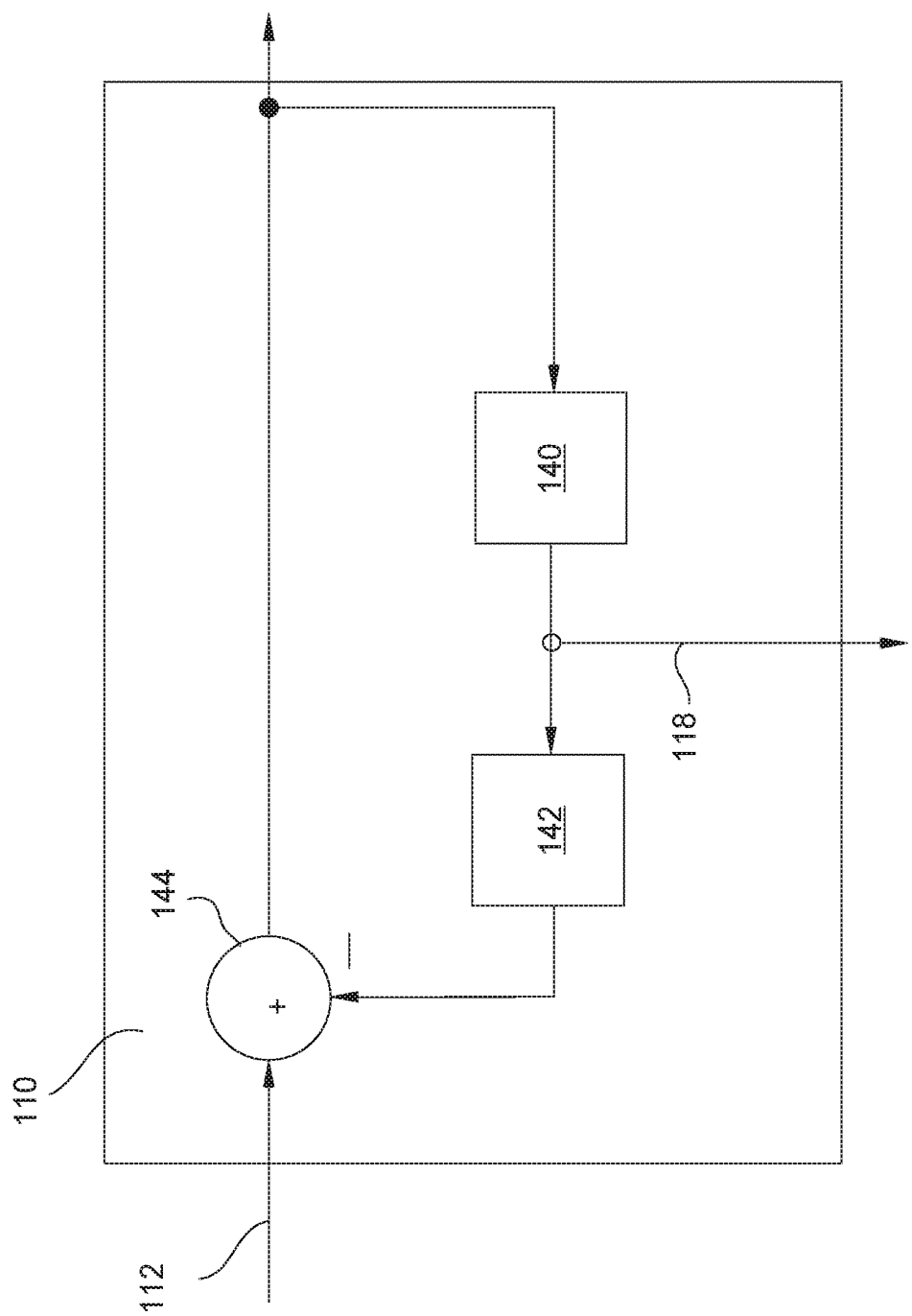
FIG. 1B depicts an example stage, according to one or more examples.

FIG. 1B illustrates a portion of a simplified circuit configuration of the stage 110. As illustrated, the stage 110 includes signal processing circuitry including an ADC 140, a digital-to-analog converter (DAC) 142, and a residue voltage generator 144. An output of the residue voltage generator 144 is electrically connected the input of the ADC 140. The output of the ADC 140 is electrically connected to the input of the DAC 142. The output of the DAC 142 is electrically connected to an input of the residue voltage generator 144. The ADC 140 is a comparator, a serial chain of comparators, or a parallel set of comparators, among others. The DAC 142 may be a switched resistor DAC, a switched current source DAC, a switched capacitor DAC, a resistor ladder DAC, a successive approximation DAC, or split-capacitor multiplying DAC, among others.

In response to the receiving the start signal 114, the differential input signal 112 is communicated to the ADC 140 of the stage 110. For example, as there is no initial output of the DAC 142, the output the residue voltage generator 144 is the differential input signal 112. The ADC 140 performs an analog-to-digital conversion process on the differential input signal 112 to generate the digital signal 118. The digital signal 118 includes one or more digital bits, and is output from the sixth terminal of the stage 110. The digital signal 118 may be provided to a processing element (e.g., combiner or other circuit). Further, the digital signal 118 is provided to the DAC 142. The DAC 142 receives the digital signal and generates a reconstructed analog voltage signal. The analog voltage signal is provided to the residue voltage generator 144. The residue voltage generator 144 generates the differential residue voltage signal 113 from the reconstructed analog voltage signal and the differential input signal 112. For example, the residue voltage generator is a subtractor configured to subtract the reconstructed analog voltage signal from the differential input signal 112.

The stage 110 is configured to output the stage end signal 119 via a corresponding terminal in response to generating and outputting the differential residue voltage signal 113. Further, the stage 110 is configured to output the stage ready signal 116 via a corresponding terminal. The stage ready signal 116 provides an indication that the stage 110 is ready to receive a subsequent input signal for processing. The stage ready signal 116 may be provided to a previous ADC block or another circuit that generates the differential input signal 112.

The stage 110 is configured to receive the clear signal 117 via a corresponding terminal, and in response to receipt of the clear signal 117, the stage 110 performs a clear process on the terminals of the stage 110. The clear signal 117 may be provided by a timing controller, or another processing device connected to the pipelined ADC.

The stage 110 may include an internal memory cell that stores a state of the stage 110. The internal memory cell may be an SR-latch or other memory element that is able to store the state of the stage 110. When the state of the internal memory cell is set to "0", the stage 110 is in a "ready" state. When the state of the internal memory cell is set to "1", the stage 110 is in a "quantization" state. The start signal 114 sets the state of the internal memory cell to "1" and the quantization process begins. When the quantization process is completed, a stage end signal is set to "1". Further, a reset signal 121 triggers the reset of all internal components of the stage 110. After the internal components of the stage 110 have been reset (e.g., a delay time), the state of the internal memory cell is set to "0" and the ready signal 116 is set to "1". In response to receiving the clear signal 117, the ADC block 100 is reset to a pre-defined state. For example, the memories of the ADC block are set to 0, and the ready signals (e.g., ready signal 116) is set to "1" and the end signals (e.g., the stage end signal 119, the reset signal 121, and the ready signal 131) is set to "0".

The differential input nodes 124 of the amplifier 120 are configured to receive the differential residue voltage signal 113. The amplifier 120 is configured to generate the differential voltage signal 123. The differential output nodes 125 of the amplifier 120 are configured to output the differential voltage signal 123.

The output node 125a, 125b of the amplifier 120 electrically connected to the input nodes 134a, 134b of the amplifier 130 via one or more switches configured to electrically connect and disconnect (e.g., electrically isolate) the input nodes 134a, 134b of the amplifier 130 of the output nodes 125a, 125b of the amplifier 120.

In some examples, the amplifier 120 is a buffer amplifier having a gain of one. In other examples, the amplifier 120 has a gain of greater than one. For example, the amplifier 120 can have a gain of two. Further, in one or more examples, the amplifier 120 is an integrating amplifier and includes load capacitors. In such examples, the gain of the amplifier 120 is adjustable based on the capacitance values of the load capacitors or by adjusting the integration time.

The amplifier 120 includes amplifier circuitry. For example, the amplifier 120 includes one or more transistors, one or more resistors, and/or one or more capacitors. The amplifier 120 is configured to generate and output the reset signal 121 in response to the amplifier 120 being ready to receive and process a differential voltage signal (e.g., the differential residue voltage signal 113) provided by the stage 110. The reset signal 121 indicates an end to the amplification operation of the amplifier 120. The reset signal 121 is provided by a delay cell that outputs or triggers the output of the reset signal 121 after the amplifier 120 settles. The reset signal 121 may be output after a fixed amount of time. Further, the delay cell may be a programmable delay cell having a delay that be varied depending on the integration time of the amplifier 120.

The amplifier 120 is electrically connected, via node 150, to the stage 110 (e.g., to the fourth terminal on which the reset signal 121 is received) and a signal combiner 154. The stage 110 is configured to receive the reset signal 121 and initiate the reset of all internal components to get ready for the next conversion cycle. Further, the stage 110 outputs the stage end signal 119 to the signal combiner 152 when the quantization is finished and the residue (e.g., the differential residue voltage signal 113) is sufficiently settled for amplification. The signal combiner 152 may be multiplication circuitry configured to the amplification process of the amplifier 120, such that the amplification process of the amplifier 120 starts when amplifier 130 is ready to sample the differential voltage signal 123.

The differential input nodes 134 of the amplifier 130 are configured to receive the differential voltage signal 123. The amplifier 130 is configured to generate the differential voltage signal 133 from the differential voltage signal 123. Further, the differential output nodes 135 are configured to output the differential voltage signal 133. The amplifier 130 has a gain of one or more. Further, the amplifier 130 can have a gain of two or more. In one or more examples, the gain of the amplifier 130 is the same as or greater than the gain of the amplifier 120. In one or more examples, the gain of the amplifier 130 is less than the gain of the amplifier 120. The amplifier 130 may be an integrating amplifier having an adjustable gain based on the size of load capacitors of the amplifier 130 or by adjusting the integration time.

The amplifier 130 includes amplifier circuitry. For example, the amplifier 130 includes one or more transistors, one or more resistors, and/or one or more capacitors. The amplifier 130 is electrically connected to the signal combiner 154 and the node 156. The amplifier 130 is configured to generate and output a ready signal 131 when the amplifier 130 is ready to receive and process a differential voltage signal (e.g., the differential voltage signal 123) provided by the amplifier 130. The ready signal 131 indicates an end to the amplification operation of the amplifier 130. The ready signal 131 may be output at the end of the integration time used by the amplifier 130 for integrating amplification. The ready signal 131 is output to the node 156.

The amplifier 120 is electrically connected to the output of the signal combiner 152. The signal combiner 152 combines the stage end signal 119 with the ready signal 131 to generate the start signal 122. The signal combiner 152 may include multiplication circuitry configured to multiply the stage end signal 119 with the ready signal 131 to generate the start signal 122. In one or more examples, the signal combiner 152 comprises AND circuitry that is configured to AND the stage end signal 119 with the ready signal 131. The amplifier 120 is configured to receive a start signal 122, and in response to receipt of the start signal 122, the amplification process of the amplifier 120 is initiated. The start signal 122 provides an indication that the amplifier 130 has completed a previous amplification operation and is ready to process an input signal (e.g., a differential voltage signal provided by the amplifier 120), and that a differential residue voltage signal (e.g., the differential residue voltage signal 113) output by the stage 110 is ready to be processed by the amplifier 120.

The amplifier 120 and the amplifier 130 are electrically connected to the signal combiner 154. For example, the amplifier 120 is electrically connected to an input node of the signal combiner 154 and outputs the reset signal 121 to the signal combiner 154. The amplifier 130 is electrically connected to the output node of the signal combiner 154 and is configured to receive a start signal 132 generated by the signal combiner 154. The signal combiner 154 includes circuitry configured to perform an "AND" operation.

The amplifier 130 is electrically connected to the output of the signal combiner 154. The signal combiner 154 combines the reset signal 121 with a stage ready signal 137 to generate the start signal 132. The stage ready signal 137 is provided from a subsequent stage electrically connected to the output of the amplifier 130 (e.g., the stage $212_2$ of FIG. 2). In one or more examples, the signal combiner 154 comprises AND circuitry that is configured to AND the reset signal 121 with the stage ready signal 137. In one or more example, the signal combiner comprises OR circuitry that is configured to OR the reset signal 121 with the stage ready signal 137. The ready signal 131 provides an indication that the amplifier 130 has completed a corresponding amplification operation and the differential voltage signal 133 is ready for processing by the subsequent stage.

The amplifier 130 is configured to receive a start signal 132, and in response to the receipt of the start signal 132, the amplification process of the amplifier 130 is initiated. For example, in response to receiving the start signal 132, the amplifier 130 generates the differential voltage signal 133 from the differential voltage signal 123.

In one or more examples, the amplifier 120 may be implemented as a Gm/Gm amplifier and the amplifier 130 may be implemented as an integrating amplifier, a Gm-R stage amplifier, or a parametric amplifier. Such an approach reduces the overall noise of a pipelined ADC comprising the ADC block 100. In other examples, the amplifiers 120 and 130 are other types of amplifiers. Further, the amplifiers 120 and 130 may be the same type, or different types of amplifiers.

The buffering and/or amplification process of the amplifier 130 is configured to be decoupled from the amplifier 120. For example, the amplifier 130 includes one or more switches electrically connected to the differential input nodes 134 that prevent a differential voltage signal generated by the amplifier 120 from affecting buffering and/or amplification process of the amplifier 130.

Figure 2:
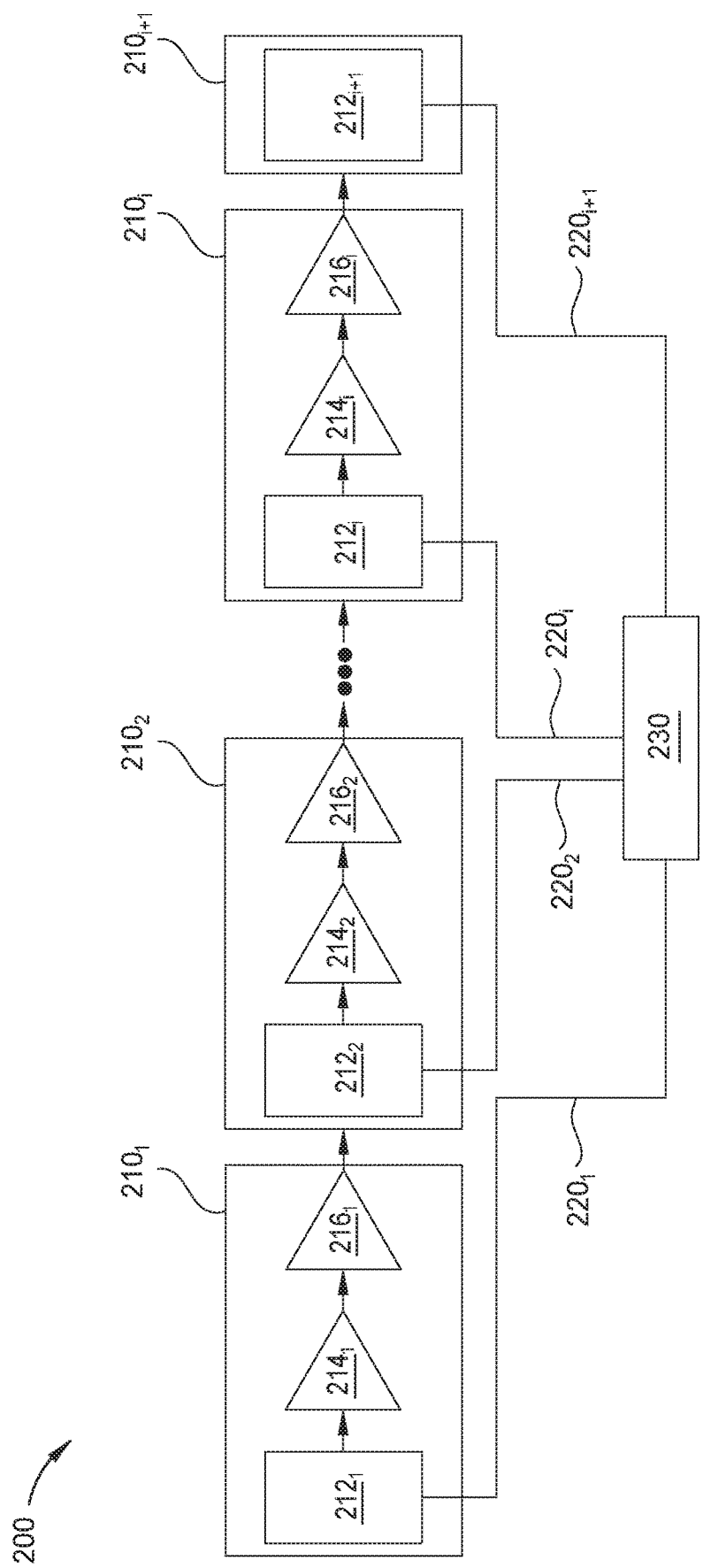
FIG. 2 depicts an example pipelined ADC, according to one or more examples.

FIG. 2 illustrates a pipelined ADC 200 having a pipelined configuration, according to one or more examples. The pipelined ADC 200 may be a SAR ADC. The pipelined ADC 200 includes ADC blocks 210. For example, the pipelined ADC 200 includes ADC blocks $210_1$, $210_2$, $210_i$, and $210_{i+1}$, where "i" is 3 or more. In one or more example, the ADC block $210_2$ and/or the ADC block $210_{i+1}$ is omitted. While the pipelined ADC 200 is illustrated as having 4 ADC blocks, in one or more examples, the pipelined ADC 200 can have any number (e.g., one or more) ADC blocks.

The ADC blocks $210_1$, $210_2$, and $210_i$ are configured similar to that of the ADC block 100. For example, each of the ADC blocks $210_1$, $210_2$, and $210_i$ includes a corresponding stage (e.g., stage $212_1$, $212_2$, and $212_i$), a corresponding first amplifier (e.g., amplifier $214_1$, $214_2$, and $214_i$), and a corresponding second amplifier (e.g., amplifier $216_1$, $216_2$, and $216_i$). Each of the stages 212 is configured similar to that of the stage 110, each of the amplifiers 214 is configured similar to that of the amplifier 120, and each of the amplifiers 216 is configured similar to that of the amplifier 130. Each of the amplifiers 214 has a differential input that is electrically connected to a differential output of a corresponding stage 212. Further, each of the amplifiers 216 has a differential input that is electrically connected to a differential output of a corresponding amplifier 214.

The ADC block $210_{i+1}$ includes a stage $212_{i+1}$ that is configured similar to that of the stage 110, but does not include corresponding amplifiers. The ADC block $210_{i+1}$ is the last block of the pipelined ADC 200. In other examples, the ADC block $210_{i+1}$ includes one or more amplifiers 214 and 216.

The ADC block $210_1$ has differential input nodes and differential output nodes. The ADC block $210_2$ has differential input nodes that are electrically connected to the differential output nodes of the ADC block $210_1$ and differential output nodes. The ADC block $210_i$ has differential input nodes that are electrically connected to the differential output nodes of the ADC block $210_2$, or an intervening ADC block. The ADC block $210_{i+1}$ has differential input nodes that are electrically connected to the differential output nodes of the ADC block $210_i$.

A differential voltage signal output by the ADC block $210_1$ is received at the differential input of the ADC block $210_2$, and the differential voltage signal output of the ADC block $210_2$ is received by the differential input of the ADC block $210_i$, or any intervening ADC blocks. The differential voltage signal output of the ADC block $210_i$ is received by the differential input of the ADC block $210_{i+1}$.

Each of the ADC blocks 210 generates a corresponding differential voltage signal from a received differential input signal as is described with regard to ADC block 100 of FIG. 1A. Further, each of the ADC blocks 210 generates one or more digital bits of a corresponding digital signal 220. Succeeding ADC blocks 210 (e.g., ADC blocks $210_2$, $210_i$, and $210_{i+1}$) generate a digital signal 220 (e.g., digital signals $220_2$, $220_i$, and $220_{i+1}$) including lower significant digital bits than preceding stages in the pipelined ADC 200.

The digital signals 220 are provided to a processing element 230. The processing element 230 combines the digital signals 220 into a digital output signal.

Figure 3:
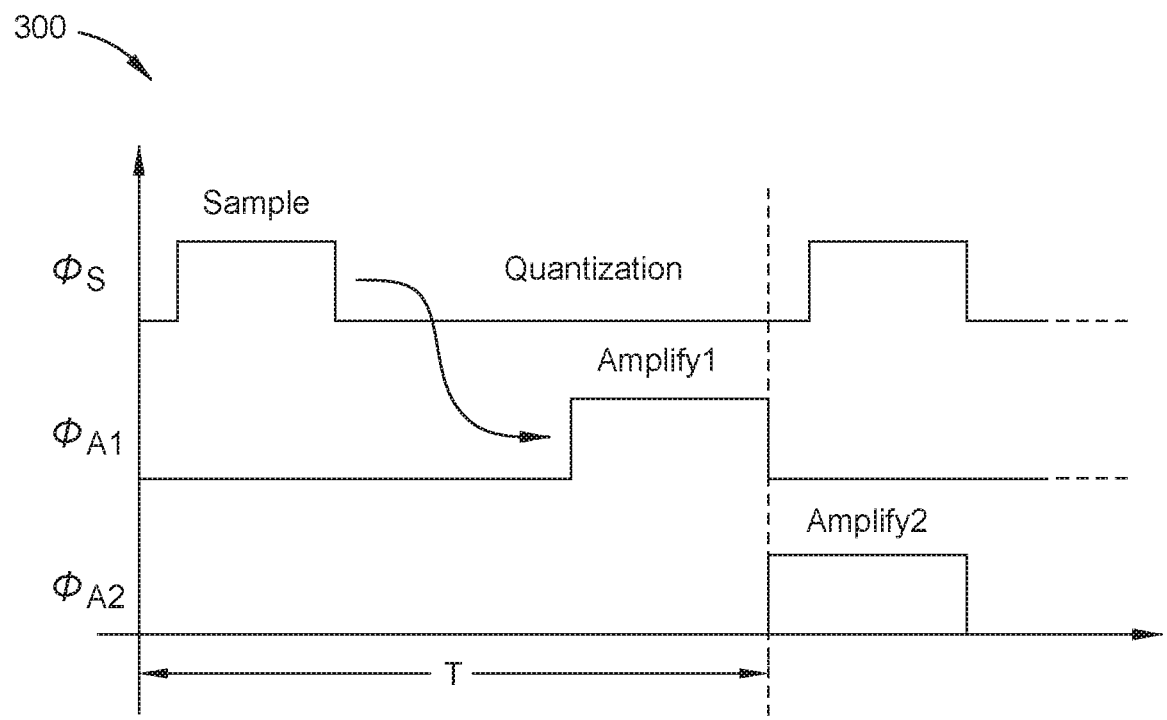

FIG. 3 illustrates a timing diagram 300 utilized to operate the ADC block 100, according to one or more examples. The timing diagram includes various periods represented by pulses. The pulses having rising and falling edges that indicate the beginning and end of each period.

As illustrated the timing diagram includes a sample period $\phi_s$ followed by an interim time for quantization that triggers an amplification period $\phi_{A1}$. The amplification period $\phi_{A1}$ is followed by an amplification period $\phi_{A2}$. The sampling period $\phi_s$ corresponds to sampling operations of the stage 110, the amplification period $\phi_{A1}$ corresponds to the operation of the amplifier 120, and the amplification period $\phi_{A2}$ corresponds to the operation of the amplifier 130. Further, as the amplification period $\phi_{A2}$ can overlap with the sampling period $\phi_s$ of a subsequent input signal processing cycle of the ADC block 100, the cycle time T of the ADC block 100 corresponds to the combined time of the sampling period $\phi_s$ and the amplification period $\phi_{A1}$. Further, the cycle time T of the ADC block 100 is less than the cycle time of an ADC block that does not utilize any overlap between the second amplification period, and a sampling period, and the processing speed of the corresponding pipelined ADC is faster than an pipelined ADC that does not include ADC blocks utilizing an overlap between sampling and amplification processes.

During the sampling period $\phi_s$, the stage 110 receives and processes the differential input signal 112 to generate the differential residue voltage signal 113 as is described above with regard to FIG. 1A.

During the amplification period $\phi_{A1}$, the amplifier 120 processes the differential residue voltage signal 113 provided by the stage 110, amplifying the differential residue voltage signal 113 to generate the differential voltage signal 123. The amplifier 120 provides a gain of greater than one to the differential residue voltage signal 113 to generate the differential voltage signal 123. In various examples, the amplifier 120 provides a gain of two to the differential residue voltage signal 113 to generate the differential voltage signal 123. During the amplification period $\phi_{A1}$, the amplifier 120 is placed in a high impendence mode. In other examples, the amplifier 120 is decoupled from the stage 110.

During the amplification period $\phi_{A2}$, the amplifier 130 processes the differential voltage signal 123 provided by the amplifier 120, amplifying the differential voltage signal 123 to generate the differential voltage signal 133. The amplifier 130 provides a gain of greater than one to differential voltage signal 123 to generate the differential voltage signal 133. In various examples, the amplifier 130 provides a gain of two to the differential voltage signal 123 to generate the differential voltage signal 133. Further, during the amplification period $\phi_{A2}$, the amplifier 130 is decoupled from the amplifier 120.

Figure 4:
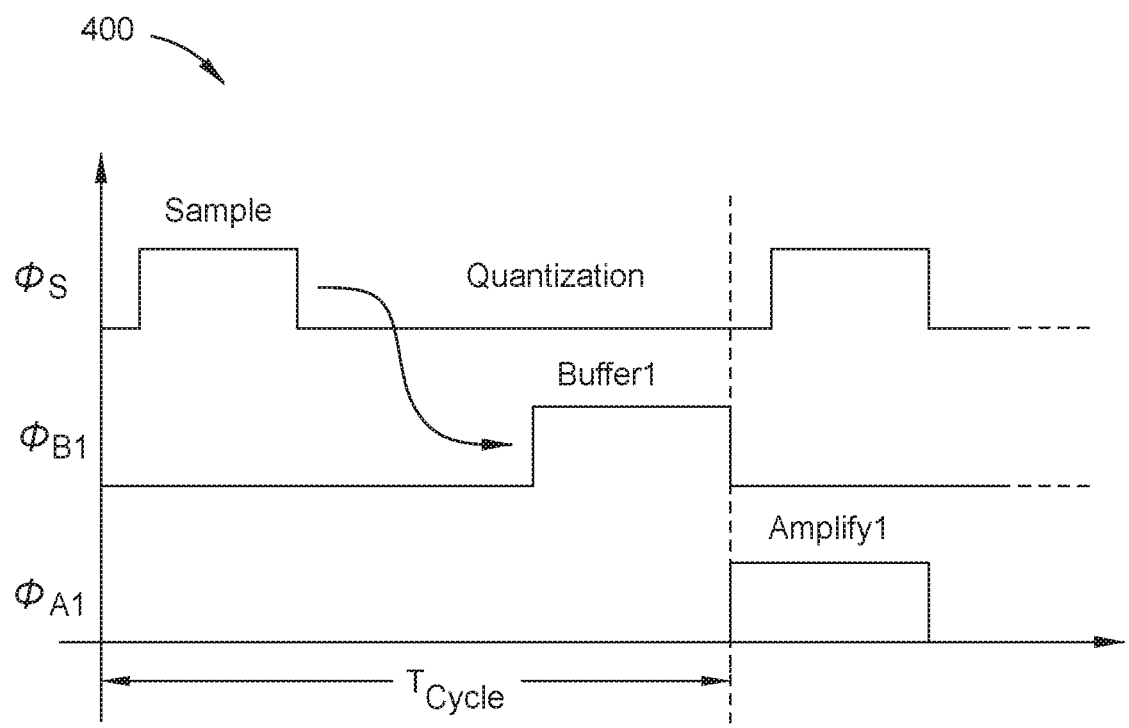

FIG. 4 illustrates a timing diagram 400 that is utilized to operate the ADC block 100, according to one or more examples. The timing diagram 400 is similar to that of the timing diagram 300. For example, the timing diagram 400 includes the sampling period $\phi_S$, the buffering period $\phi_{B1}$ and the amplification period $\phi_{A1}$ that overlaps with at least a portion of a sampling period of a subsequent cycle time. However, as compared to the amplification period $\phi_{A1}$ of the timing diagram 300, during the buffering period $\phi_{B1}$ of the timing diagram 400, buffering is performed on the differential residue voltage signal 113 to generate the differential voltage signal 123.

FIG. 5 illustrates a timing diagram 500 that is utilized to operate the ADC blocks 210, according to one or more examples. The timing diagram 500 includes multiple stage periods (e.g., stage period 510, and stage period 520) each corresponding to a different ADC block 210. For example, the stage period 510 corresponds ADC block $210_1$ and the stage period 520 corresponds to ADC block $210_2$. The length of the stage periods 520 are the same (e.g., time T). Alternatively, the stage period 510 may be longer than or shorter than the stage period 520.

The timing diagram includes a sampling period $\phi_{S1}$, a quantization period $\phi_{Q1}$, a reset period $\phi_{R1}$, an amplification period $\phi_{A1}$, an amplification period $\phi_{A2}$, a sampling period $\phi_{S2}$, an amplification reset period $\phi_{A1R1}$, a reset period $\phi_{R2}$, and a quantization period $\phi_{Q2}$. The amplification period $\phi_{A2}$ and sampling period $\phi_{S2}$ are overlapping such that they occur during a common time period.

During each stage period 510, 520, the operations of sampling of input signal ($\phi_S$), quantization ($\phi_Q$) and residue amplification ($\phi_A$) are completed. These operations determine the period of one or more stages of a pipelined ADC (e., the pipelined ADC 200 of FIG. 2). The last stage of the pipelined ADC (e.g., ADC block $210_{i+1}$ of FIG. 2) includes two operations, e.g., sampling and quantization of a voltage signal provided from a preceding stage. Further, the throughput of a pipelined ADC (e., the pipelined ADC 200 of FIG. 2) corresponds to the stage having the longest period.

With reference to FIG. 2, the sampling period $\phi_{S1}$, the quantization period $\phi_{Q1}$, and the ready period $\phi_{R1}$ are associated with the stage $212_1$ of the ADC block $210_1$. For example, on the rising edge of each pulse of the corresponding sampling period $\phi_{S1}$, a sampling operation, quantization operation, and reset operation is triggered inside stage $212_1$. As is illustrated in FIG. 5, the rising edge of the sampling period $\phi_{S1}$ is aligned with the rising edge of the ready period $\phi_{R1}$.

The amplification ready period $\phi_{A1R1}$ corresponds to the timeframe for which amplifier $214_1$ is ready to start amplification, and the amplification period $\phi_{A1}$ is the period for amplification or buffering of the differential residue voltage signal generated by stage $212_1$ by the amplifier $214_1$. For example, amplification or buffering of the differential residue voltage signal is initiated by the rising edge of the amplification period $\phi_{A1}$ signal.

The amplification period $\phi_{A2}$ corresponds to the amplification of a differential voltage signal by the amplifier $216_1$. For example, during the amplification period $\phi_{A2}$, the differential voltage signal generated by the amplifier $214_1$ is amplified by the amplifier $216_1$. For example, amplification of the differential voltage signal output by the amplifier $214_1$ is initiated by the rising edge of the amplification period $\phi_{A2}$.

The sampling period $\phi_{S2}$, the quantization period $\phi_{Q2}$, and the ready period $\phi_{R2}$ are associated with the stage $212_2$ of the ADC block $210_2$. For example, on the rising edge of each pulse of each signal of each corresponding period, a sampling operation, quantization operation, and reset operation is carried out by the stage $212_2$.

As illustrated in the timing diagram 500, the time between the rising edge of the $\phi_{A1R1}$ and the rising edge of $\phi_{A1}$ corresponds to the slack time available in stage $212_1$ to absorb metastability events in the stage $212_2$. Further, the second ADC block (e.g., the ADC block $210_2$) presents similar slack time to deal with metastability evens of the third SAR ADC block (e.g., the ADC block $210_3$). A similar relationship exists for each of the stages 210 in the pipelined ADC 200. Any metastability event corresponding to the first stage is absorbed by compressing the sampling time.

The sampling period of $\phi_{S2}$ of the second ADC block (e.g., the ADC block $210_2$) is aligned with the amplification period $\phi_{A2}$ of the first ADC block e.g., the ADC block $210_1$). Accordingly, the amplification period $\phi_{A2}$ does not affect the slack time for the first ADC block. Further, the process time of the ADC block $210_1$ and the ADC block $210_2$ is reduced as compare to ADC blocks that do not employ overlapped sampling and amplification processes. Further, time periods of the amplification periods $\phi_{A1}$ and $\phi_{A2}$ are independently controlled. Such an implementation increases the metastability related slack time (e.g., the metastability budget).

Figure 6A:
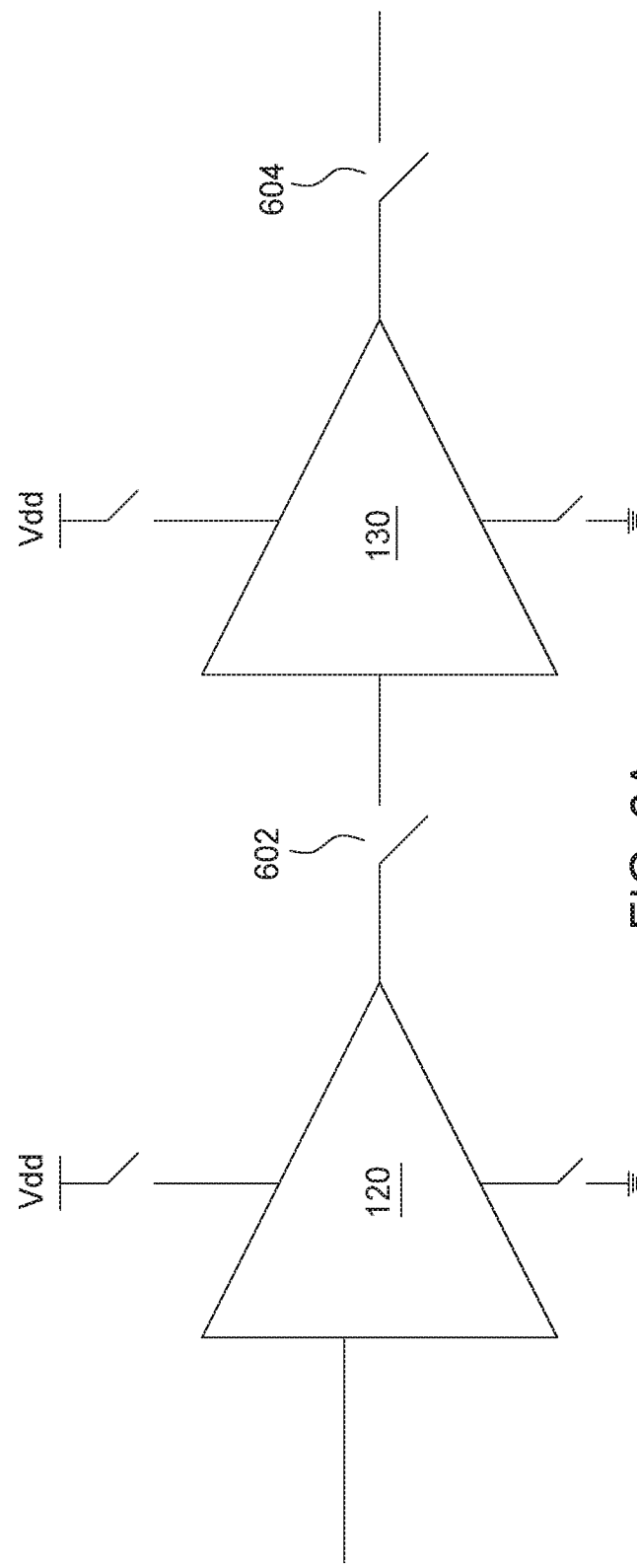
FIG. 6A illustrates an example ADC block, according to one or more examples.

As illustrated in FIG. 6A, the switch 602 is electrically connected between the output node or nodes of the amplifier 120 and the input node or nodes of the amplifier 130. The switch 602 is configured to electrically connect and disconnect the output node or nodes of the amplifier 120 from the input node or nodes of the amplifier 130. Further, the output nodes of the amplifier 130 is electrically connected to a switch 604 that is configured to electrically connect and disconnect the output node or nodes of the amplifier 130 with an input node or nodes of a subsequent stage.

Figure 6B:
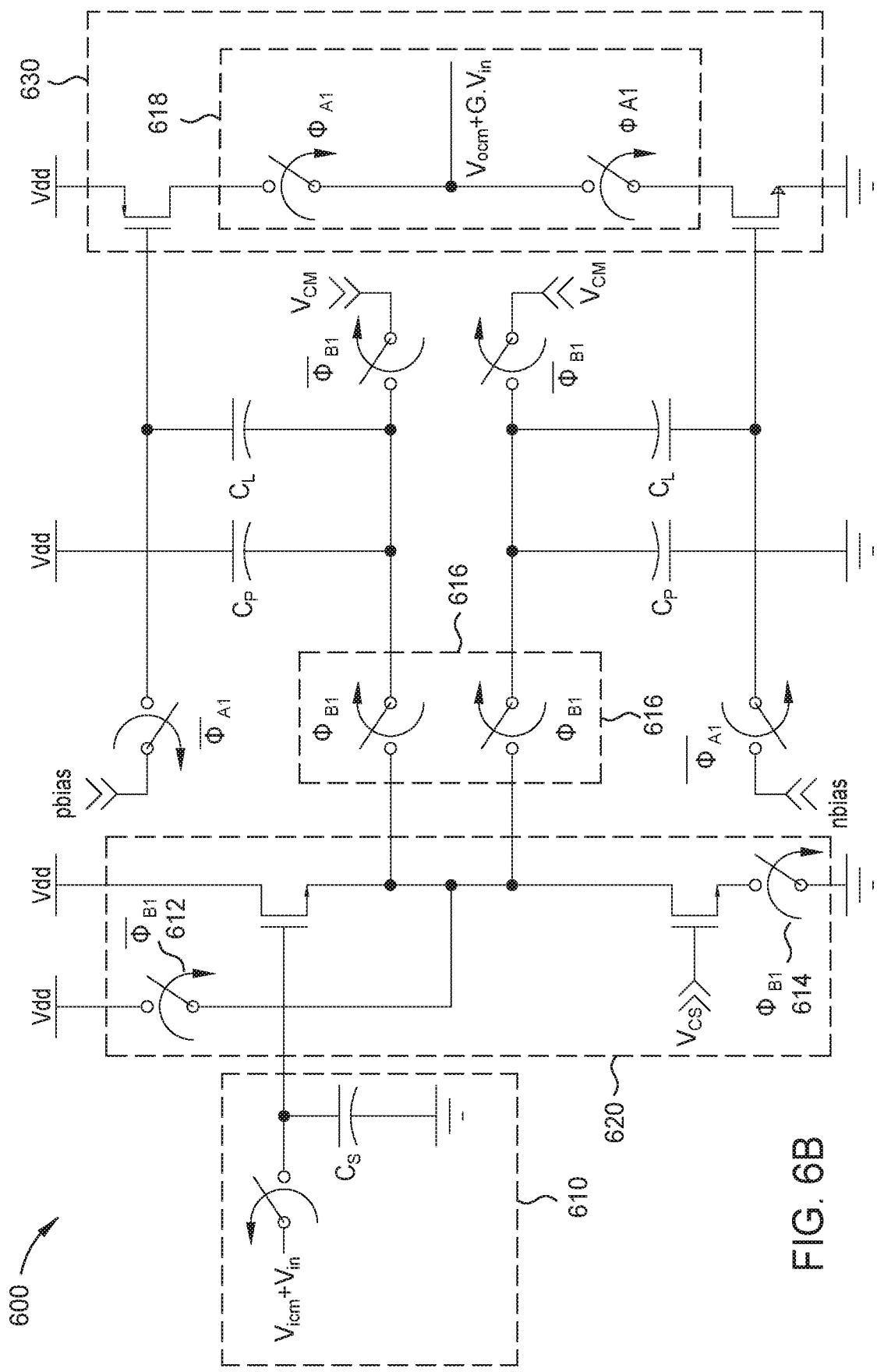
FIG. 6B illustrates an example ADC block, according to one or more examples.

FIG. 6B illustrates an example ADC block 600, according to one or more examples. The ADC block 600 includes both the amplifier 620 and the amplifier 630. The amplifier 620 and amplifier 630 are example amplifiers. In other examples, other amplifier topologies may be utilized.

The ADC block 600 includes stage 610, amplifier 620, and amplifier 630. The stage 610 is a simplified representation of the stage 110 of FIG. 1A. The output node of the stage 610 is electrically connected to an input node of the amplifier 620, and the output node of the amplifier 620 is electrically connected to the input node of the amplifier 630. Further, switches 616 are electrically connected to the output node of the amplifier 620 and the input node of the amplifier 630. The switches 616 electrically connect and disconnect the output node of the amplifier 620 with the input node of the amplifier 630.

The amplifier 620 is an example of the amplifier 120. As illustrated the amplifier 620 includes a current follower. However, in other embodiments, the amplifier 620 includes a buffer instead of a current follower. The switches 612 and the amplifier 130. In other instances, other amplifier circuitry configurations may be utilized. As illustrated in FIG. 6B, the switches 612 and 614 are utilized to disable the amplifier 620. For example, when the switch 612 is in closed state and 614 is in an opened state, the amplifier 620 is disabled and when the switch 612 is in open state and 614 in in a closed state, the amplifier 620 is in an enabled state.

The amplifier 630 is electrically connected and disconnected from a subsequent stage via the switches 618. The amplifier 630 is an example buffer that may be implemented as the amplifier 130. In other examples, the amplifier 130 may have a different configuration.

The switches 616 are configured to electrically connect and disconnect the output nodes of the amplifier 620 from the input nodes of the amplifier 630. In one embodiment, the switches 616 may be replaced by a single switch.

Figure 7:
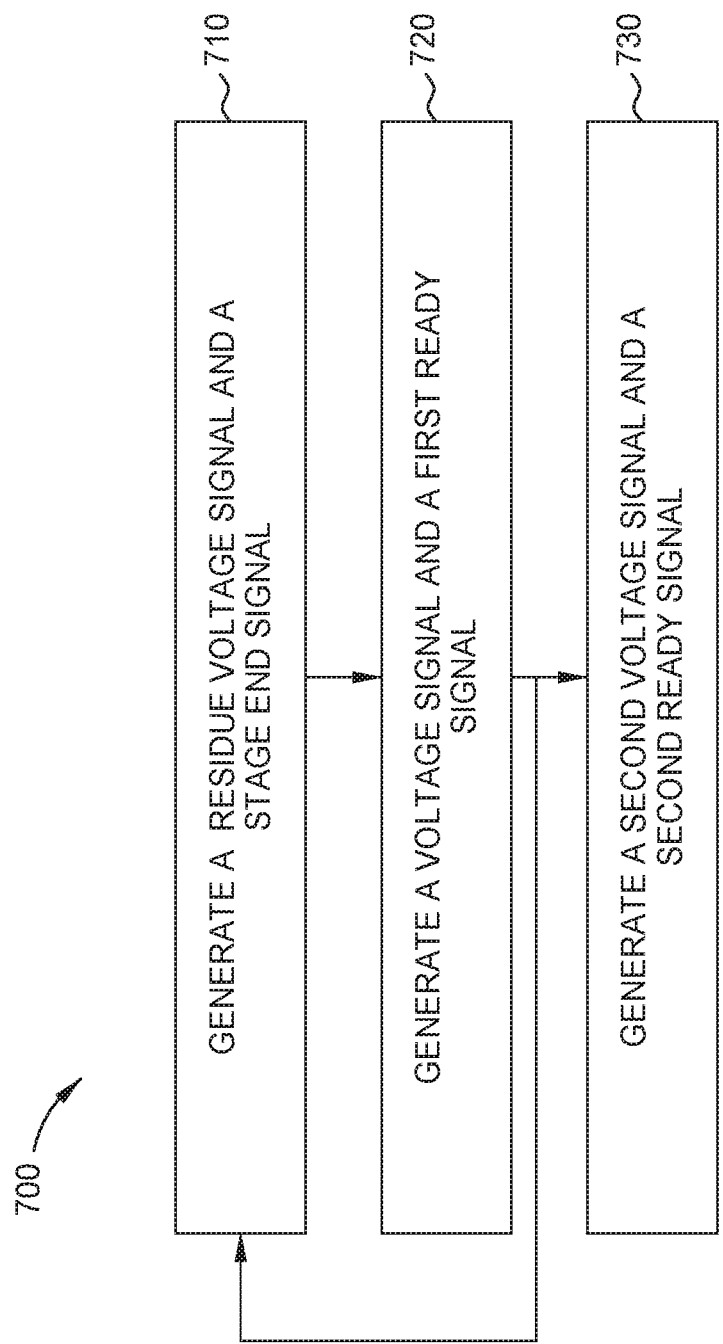
FIG. 7 illustrates an example flow chart of a method for operating a pipelined ADC, according to one or more examples.

FIG. 7 illustrates a method 700 for operating a pipelined ADC, according to one or more examples. At operation 710, a differential residue voltage, and a stage end signal are generated. For example, the stage 110 receives the differential input signal 112 at the differential input nodes 111, and generates a differential residue voltage signal (e.g., the differential residue voltage signal 113) based on the differential input signal 112. Further, the stage 110 generates a stage end signal (e.g., the stage end signal 119) in response to generating the first residue voltage signal.

At operation 720, a first differential voltage signal and a first ready signal are generated. The first differential voltage signal is generated from the differential residue voltage signal and the first ready signal is generated in response to the generation of the first differential voltage signal. For example, the amplifier 120 receives the differential residue voltage at differential input nodes 124 and generates a first differential voltage signal (e.g., the differential voltage signal 123) from the first differential residue voltage signal. Generating the first differential voltage signal comprises amplifying the differential residue signal with a gain of greater than 1 or buffering the differential residue signal. Further, the amplifier 120 generates a first ready signal (e.g., the reset signal 121). The reset signal 121 is received by the stage 110 to reset the stage 110 and processing of a subsequent differential input signal is initiated in response to receiving the ready signal.

At operation 730, a second differential voltage signal and a second ready signal are generated. The second differential voltage signal is generated from the first differential voltage signal and the second ready signal is generated in response to the generation of the second differential voltage signal. For example, the amplifier 130 generates the second differential voltage signal (e.g., the differential voltage signal 133) from the first differential voltage signal and a second ready signal (e.g., the ready signal 131). Generating the second differential voltage signal comprises amplifying the first differential voltage signal with a gain of greater than 1. With reference to FIG. 1A, the amplifier 120 receives the ready signal 131, and initiates an amplification or buffering operation in response to receiving both the ready signal 131 and the end signal 119 of stage 110.

In one example, the generation of a differential residue voltage signal and a stage end signal is repeated after the differential voltage signal and first ready signal of operation 720 is completed.

The ADC block 100 and/or the pipelined ADC 200 is implemented as part of an integrated circuit (IC). The IC may be a programmable logic device (PLD) that is programmed to perform specified logic functions. One type of PLD is a field programmable gate array (FPGA) as is illustrated in FIG. 8. The FPGA 800 may be implemented as a programmable device according to some examples. The FPGA 800 includes a large number of different programmable tiles that form a programmable fabric including configurable logic blocks (CLBs) 802, random access memory blocks (BRAMs) 804, signal processing blocks (DSPs) 806, input/output blocks (IOBs) 808, and configuration and clocking logic (CONFIG/CLOCKS) 810. The FPGA 800 also includes a dedicated processor block 812, digital transceivers 814, dedicated hardblocks 816, specialized input/output blocks (IO) 818 (e.g., configuration ports and clock ports), and other programmable logic 820 such as digital clock managers, system monitoring logic, and so forth. The hardblocks 816 can be any circuit, such as a memory controller, a Peripheral Component Interconnect Express (PCIe) hardblock, etc.

In the illustrated FPGA 800, each programmable tile includes a programmable interconnect element (INT) 830 having connections to input and output terminals of respective programmable interconnect elements 830 in each adjacent tile and having connections to input and output terminals of a programmable logic element within the same tile. The programmable interconnect elements 830 taken together implement a programmable interconnect structure for the illustrated FPGA 800.

As an example, a CLB 802 includes a configurable logic element (CLE) 832 that can be programmed to implement user logic plus a single programmable interconnect element 830. A BRAM 804 can include a BRAM logic element (BRL) 834 in addition to one or more programmable interconnect elements 830. Typically, the number of interconnect elements included in a tile depends on the height of the tile. In the illustrated example, a BRAM tile has the same height as five CLBs, but other numbers (e.g., four) can also be used. A signal processing block 806 can include a DSP logic element (DSPL) 836 in addition to an appropriate number of programmable interconnect elements 830. An input/output block 808 can include, for example, two instances of an input/output logic element (IOL) 838 in addition to one instance of the programmable interconnect element 830. As will be clear to those of skill in the art, the actual I/O pads connected, for example, to the input/output logic element 838 typically are not confined to the area of the input/output logic element 838.

In the illustrated example, a horizontal area near the center of the die is used for configuration, clock, and other control logic. Vertical columns 840 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 812 spans several columns of CLBs and BRAMs.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA, more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. An analog-to-digital (ADC) circuit comprising:
   a first stage comprising signal processing circuitry, the first stage being configured to receive a differential input signal and to generate a differential residue voltage signal on differential output nodes of the first stage;
   a first amplifier comprising first amplifier circuitry, the first amplifier being electrically connected to the differential output nodes of the first stage, and configured to:
      receive the differential residue voltage signal; and
      generate a first differential voltage signal from the differential residue voltage signal; and
   a second amplifier comprising second amplifier circuitry, the second amplifier being electrically connected to differential output nodes of the first amplifier, and configured to:
      receive the first differential voltage signal; and
      generate a second differential voltage signal from the first differential voltage signal.

2. The ADC circuit of claim 1, wherein the first stage is further configured to:
   generate the differential residue voltage signal in response to receiving a start signal received.

3. The ADC circuit of claim 1, wherein:
   the second amplifier is further configured to generate a first ready signal; and
   the first amplifier is further configured to start generation of the first differential voltage signal based at least in part on the first ready signal.

4. The ADC circuit of claim 3, wherein,
   the first stage is further configured to generate a stage end signal; and
   the first amplifier is further configured to start generation of the first differential voltage signal based at least in part on the stage end signal.

5. The ADC circuit of claim 1, wherein the first stage is configured to generate the differential residue voltage signal during a first period, and the second amplifier is configured to generate the second differential voltage signal during a second period.

6. The ADC circuit of claim 5, wherein the first period at least partially overlaps with the second period.

7. The ADC circuit of claim 5, wherein the first amplifier is configured to generate the first differential voltage signal during a third period that is non-overlapping with the first period and the second period.

8. The ADC circuit of claim 1, wherein a gain of the first amplifier is 1 or more, and a gain of the second amplifier is 1 or more.

9. A pipelined analog-to-digital (ADC) circuit comprising:
   a first ADC block;
   a second ADC block electrically connected to differential input nodes of the first ADC block, wherein the second ADC block comprises:
      a first stage configured to:
         receive a differential input signal; and
         generate a first differential residue voltage signal from the differential input signal received during a first period and generate a second differential residue voltage signal from the differential input signal received during a second period immediately subsequent to the first period, wherein generating the first differential residue voltage signal and generating the second differential residue voltage signal are non-overlapping;
      a first amplifier electrically connected to first differential output nodes of the first stage and configured to:
         generate a first differential voltage signal from the first differential residue voltage signal; and
      a second amplifier electrically connected to second differential output nodes of the first amplifier and configured to:
         generate a second differential voltage signal from the first differential voltage signal during the second period.

10. The pipelined ADC circuit of claim 9 further comprising a third ADC block electrically connected to differential input nodes of the first stage.

11. The pipelined ADC circuit of claim 9, wherein:
    the second amplifier is further configured to generate a ready signal; and
    the first amplifier is configured to generate the first differential voltage signal in response to, at least in part, the ready signal.

12. The pipelined ADC circuit of claim 11, wherein:
    one or more stages is further configured to generate a stage end signal; and
    the first amplifier is configured to generate the first differential voltage signal in response to, at least in part, the stage end signal.

13. The pipelined ADC circuit of claim 9, wherein at least a portion of the second amplifier is configured to be decoupled from the first amplifier during the second period.

14. The pipelined ADC circuit of claim 13, wherein the first amplifier is configured to generate the first differential voltage signal during a third period that is non-overlapping with the first period and the second period.

15. A method for operating an analog-to-digital converter (ADC) comprising:
    generating, at a first stage of a first ADC block, a first differential residue voltage signal from an input signal;

generating, at a first amplifier of the first ADC block, a first differential voltage signal from the first differential residue voltage signal; and generating, at a second amplifier of the first ADC block, a second differential voltage signal from the first differential voltage signal in response to, at least in part, a ready signal generated by the first amplifier.

16. The method of claim 15 further comprising generating the first differential residue voltage signal in response to receiving a start signal.

17. The method of claim 15 further comprising generating the first differential voltage signal in response to, at least in part, a second ready signal generated by the second differential voltage signal.

18. The method of claim 17 further comprising generating the first differential voltage signal in response to, at least in part, a stage end signal generated by the first stage.

19. The method of claim 15 further comprising generating, at the first stage, a second different residue voltage signal during a second period immediately subsequent to a first period, wherein during the first period, the first differential residue voltage signal is generated, and wherein the second differential voltage signal is generated during the second period.

20. The method of claim 19, wherein the first differential voltage signal is generated during a third period that is non-overlapping with the first period and the second period.

* * * * *